United States Patent
Yang et al.

(10) Patent No.: US 7,486,574 B2
(45) Date of Patent: Feb. 3, 2009

(54) ROW ACTIVE CONTROL CIRCUIT OF PSEUDO STATIC RANOM ACCESS MEMORY

(75) Inventors: Jong Yeol Yang, Gyeonggi-do (KR); Yin Jae Lee, Gyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/074,894

(22) Filed: Mar. 9, 2005

(65) Prior Publication Data
US 2005/0226074 A1    Oct. 13, 2005

(30) Foreign Application Priority Data
Apr. 13, 2004    (KR) .................. 10-2004-0025476

(51) Int. Cl.
*G11C 7/00*    (2006.01)
(52) U.S. Cl. .................. 365/191; 365/222; 365/203
(58) Field of Classification Search .................. 365/229, 365/222, 203, 191
See application file for complete search history.

(56) References Cited

U.S. PATENT DOCUMENTS 6,744,684 B2 *   6/2004   Arimoto et al. ............. 365/222
6,829,192 B2 *   12/2004  Shinozaki et al. ........... 365/222

* cited by examiner

*Primary Examiner*—Amir Zarabian
*Assistant Examiner*—Kretelia Graham
(74) *Attorney, Agent, or Firm*—Townsend and Townsend and Crew LLP (57) ABSTRACT

A row active control circuit of a PSRAM controls a refresh timing when a refresh operation is performed before activation of a row path for embodiment of a page mode, thereby preventing mis-operations. The row active signal generating unit generates a row active signal when an active condition is set by the internal active signal. The internal active signal generating unit generates the internal active signal in response to a refresh start signal. The row active control unit generates a row active standby signal with the row active signal in response to the internal active signal. The external active signal generating unit for generating an external active control signal in response to the row active standby signal.

2 Claims, 8 Drawing Sheets

Fig.8

ROW ACTIVE CONTROL CIRCUIT OF PSEUDO STATIC RANOM ACCESS MEMORY

BACKGROUND ART

1. Field of the Invention

The present invention generally relates to a row active control circuit of a pseudo static random access memory (hereinafter, abbreviated as "PSRAM"), and more specifically, to an improved row active control circuit of a PSRAM for controlling a refresh timing when a refresh operation is performed before activation of a row path for embodiment of a page mode, thereby preventing mis-operations.

2. Description of the Prior Art

Generally, a dynamic random access memory (hereinafter abbreviated as "DRAM") memorizes information as a type of charges in a cell capacitor, transmits the charges, which is stored in the cell capacitor, to a corresponding bit line through an access transistor, and then amplifies the charges by a sensing amplifier to read data.

In the above-described DRAM, since a memory cell comprises an access transistor and a cell capacitor, the area occupied by the memory cell is small, so that a memory having a large memory capacity can be embodied with a small area.

Meanwhile, a memory device has been recently microscopic for high-speed operation of the memory device, for reduction of power consumption and miniaturization of the processing system. As a result, the area of the cell capacitor becomes smaller, and the capacity of the cell capacitor also becomes smaller. Although data having the same voltage level are inputted to the capacitor, the amount of sustaining charges becomes smaller if the capacity of the cell capacitor becomes smaller.

In order to compensate the reduction in the amount of sustaining charges, a refresh operation is periodically performed. In the refresh operation, data stored in the cell capacitor is transmitted to the bit line, amplified by the sensing amplifier, and then re-written in the cell capacitor.

As a result, when a data sustaining characteristic is degraded in the microscopic device, a refresh cycle is set to be short in order to compensate degradation of the data sustaining characteristic. However, when the refresh cycle is short, an external processing device is unable to access the DRAM during the refresh operation, thereby degrading performance of the processing system.

Also, when the refresh cycle is short, power consumption for the refresh operation increases. Specifically, the short refresh cycle does not meet a low standby current condition required in a data sustaining mode of a battery driving portable device, and cannot be applied to the battery driving portable device requiring low power consumption.

A PSRAM that operates the DRAM like a static random access memory (hereinafter, abbreviated as "SRAM") has been known to solve the refresh problem of the DRAM. In the PSRAM, a cycle for performing read and write operations of common data and a refresh cycle for performing a refresh operation are successively performed in one cycle of a memory access cycle. That is, since the refresh operation is performed on one access cycle, the refresh operation can be hidden to an external access, so that the DRAM can be operated as the SRAM.

A row path in a general memory device includes serial processes for selecting a word line corresponding to a row address among a plurality of word lines, for transmitting data stored in a memory cell connected to the selected word line by sharing charges in a bit line, and for sensing the data in the bit line and amplifying the data at a level having a full swing width by a bit line sensing amplifier.

A column path in the memory device includes serial processes for selecting a memory cell corresponding a column address, and for externally outputting data in a bit line.

Generally, the row path is longer than the column path, so that it takes more time.

In order to solve the above-described problem, a page mode has been introduced to perform an effective read or write operation on the memory device. Here, the page means a memory cell which has the same word line in a different column address.

Both of the row path and the column path are not performed whenever data are stored or read in the memory cell. The row path is once performed at the initial stage in a different column address while a word line is activated, thereby enabling the read and write operation to be performed at a high speed.

Figure 1:
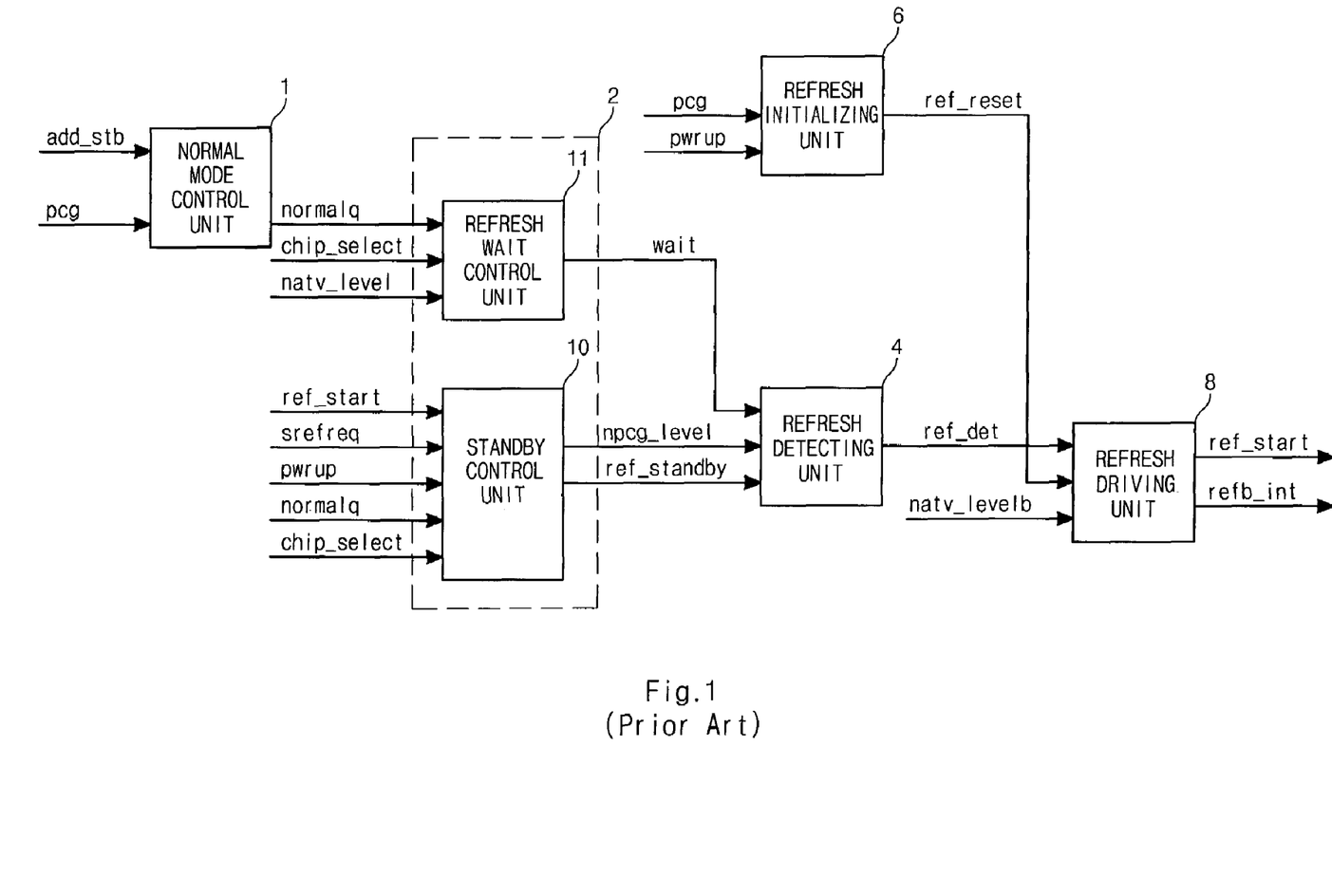
FIG. 1 is a block diagram illustrating a refresh control circuit of a conventional PSRAM.

FIG. 1 is a block diagram illustrating a refresh control circuit of a conventional PSRAM.

The refresh control circuit of FIG. 1 comprises a normal mode control unit 1, a refresh preventing control unit 2, a refresh detecting unit 4, a refresh initializing unit 6 and a refresh driving unit 8. Here, the refresh preventing control unit 2 includes a standby control unit 10 and a refresh wait control unit 11.

Figure 2:
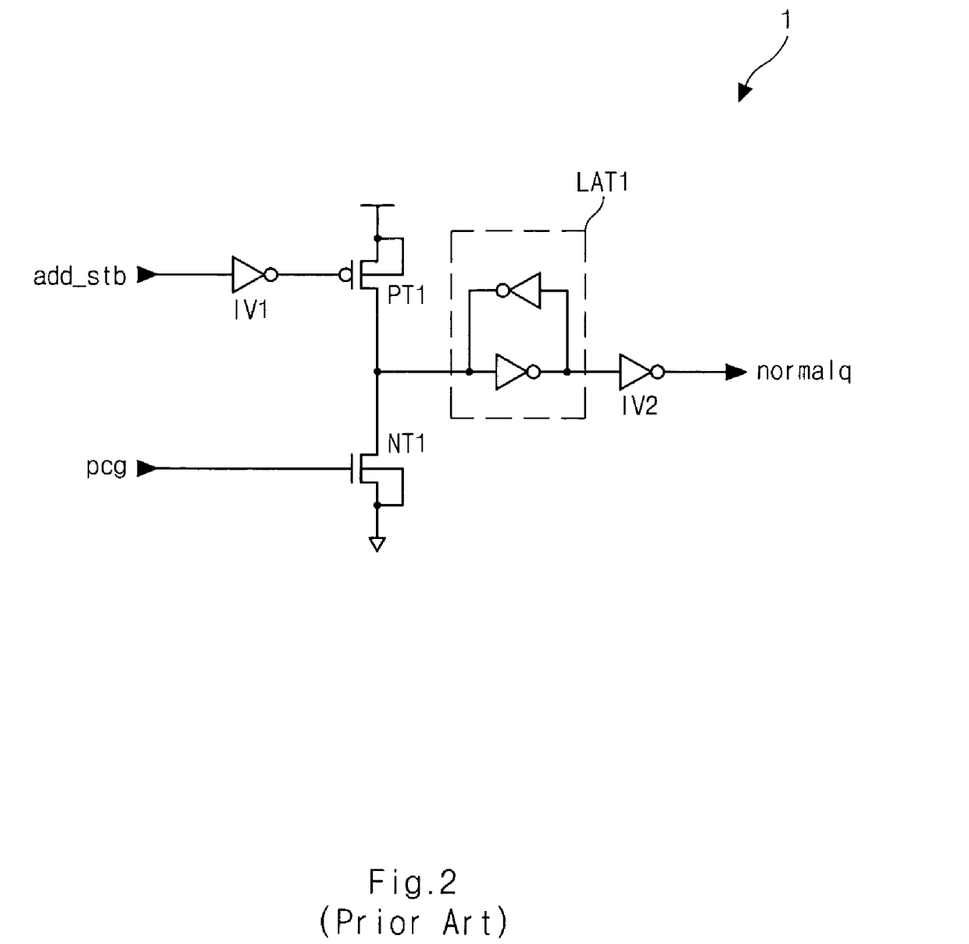
FIG. 2 is a circuit diagram illustrating a normal mode control unit 1 of FIG. 1.

FIG. 2 is a circuit diagram illustrating the normal mode control unit 1 of FIG. 1.

The normal mode control unit 1 comprises inverters IV1 and IV2, a PMOS transistor PT1, a NMOS transistor NT1 and a latch unit LAT1.

The normal mode control unit 1 generates a normal mode control signal normalq in response to an address strobe signal add_stb and a precharge signal pcg.

When an address is changed, the address strobe signal add_stb is activated, so that the normal mode control signal normalq is activated to a high level by the PMOS transistor PT1.

Meanwhile, when the precharge signal pcg is activated, the normal mode control signal normalq is inactivated to a low level by the NMOS transistor NT1. Here, the latch unit LAT1 maintains the level state of the normal mode control signal normalq.

The standby control unit 10 of the refresh preventing control unit 2 generates a refresh standby state setting signal ref_standby when a self-refresh requiring signal srefreq is activated.

Here, when the precharge signal pcg is generated after a precharge or internal performance operation is externally completed, an idle state starts internally, so that a refresh operation can be performed.

A normal mode control signal normalq, which is generated when a row access performance is externally performed, requires a precharge period when an address is changed. Here, the refresh operation is prevented.

If the refresh operation is performed when the normal mode control signal normalq is generated, the refresh operation is performed in the precharge period to destroy cell data.

When the normal mode control signal normalq or a level signal natv_level is generated, the wait control unit 11 generates a wait signal so that the refresh operation may not be performed.

When the refresh operation is at the standby state, the wait signal is inactivated to a low level by the precharge operation and a level signal npcg_level delayed in the precharge operation is inputted, the refresh detecting unit 4 generates a refresh detecting signal ref_det to perform the refresh operation.

A refresh start signal ref_start is generated to have a high pulse depending on external row access. Here, if the level signal natv_level is required and the row access is faster than an internal refresh signal refb_int, the pulse of the refresh start signal ref_start is not generated, and the refresh operation is performed after the row access.

Figure 3:
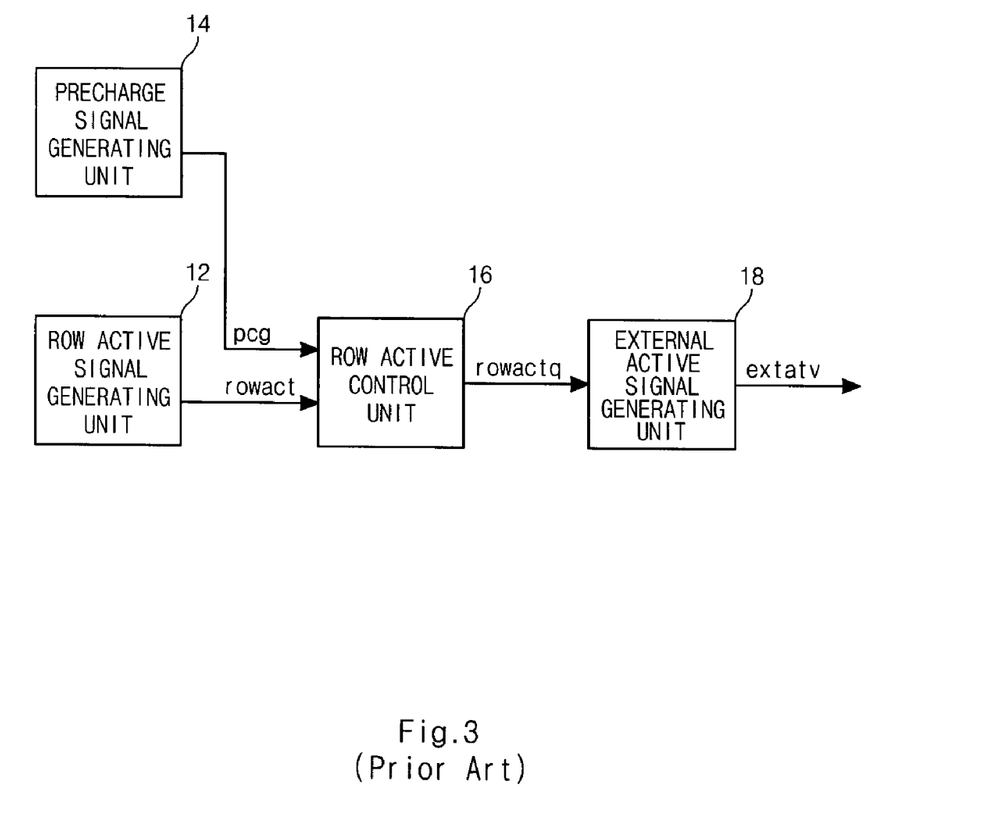
FIG. 3 is a block diagram illustrating a row active control circuit of a conventional PSRAM.

FIG. 3 is a block diagram illustrating a row active control circuit of a conventional PSRAM.

The row active control circuit of FIG. 3 comprises a row active signal generating unit 12, a precharge signal generating unit 14, a row active control unit 16 and an external active signal generating unit 18.

The row active signal generating unit 12 generates a row active signal rowact when an active condition is set.

The precharge signal generating unit 14 generates a precharge signal pcg when a precharge condition is set.

The row active control unit 16 generates a row active standby signal rowactq with the row active signal rowact in response to the precharge signal pcg.

The external active signal generating unit 18 generates an external active control signal extatv in response to the row actie standby signal rowactq.

Figure 4:
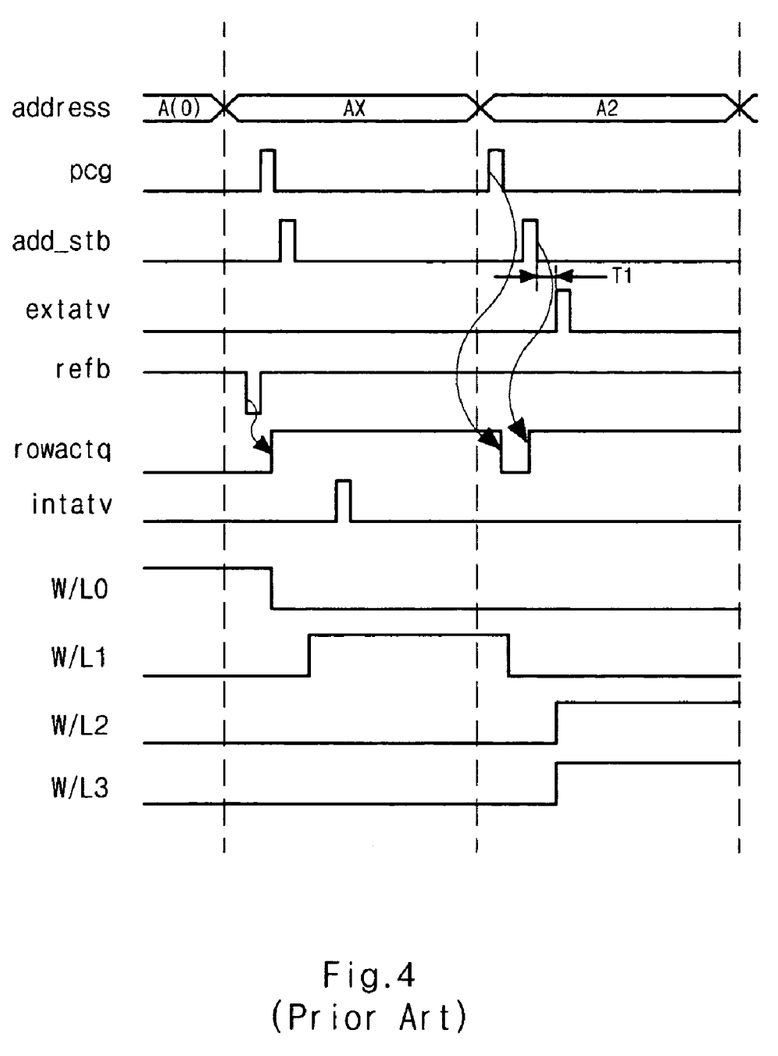
FIG. 4 is a timing diagram illustrating the operation of the row active control circuit of FIG. 3.

FIG. 4 is a timing diagram illustrating the operation of the row active control circuit of FIG. 3. Here, an example when a word line W/L1 is refreshed is exemplified, so that an address AX is invalid.

First, when an external address is changed the precharge signal pcg is generated, the normal mode control signal normalq is located at the same time period.

When the normal mode control signal normalq and the precharge signal pcg are located at the same time period, an address strobe signal add_stb to receive the address is generated. Then, a row active signal rowact for generating an active signal extatv or intatv is generated.

Here, when the refresh signal refb is generated, the row active signal rowact becomes at a standby state, so that the row active standby signal rowactq is generated.

If the address is changed while the row active standby signal rowactq is enabled, the precharge signal pcg is generated to be reset. Here, an interval T1 between the address strobe signal addstb and the external active signal becomes short, so that more than two word lines W/L2 and W/L3 are activated as shown in FIG. 4. As a result, the normal operation cannot be performed or a characteristic margin is reduced.

SUMMARY OF THE INVENTION

Accordingly, it is an object of the present invention to prevent fail which results from reception of more than two addresses when a refresh operation and a normal operation are simultaneously inputted at a high-speed operation mode for performing a page operation in a PSRAM.

In an embodiment, a row active control circuit of a PSRAM comprises a row active signal generating unit, an internal active signal generating unit, a row active control unit and an external active signal generating unit. The row active signal generating unit generates a row active signal when an active condition is set by the internal active signal. The internal active signal generating unit generates the internal active signal in response to a refresh start signal. The row active control unit generates a row active standby signal with the row active signal in response to the internal active signal. The external active signal generating unit for generating an external active control signal in response to the row active standby signal.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 5:
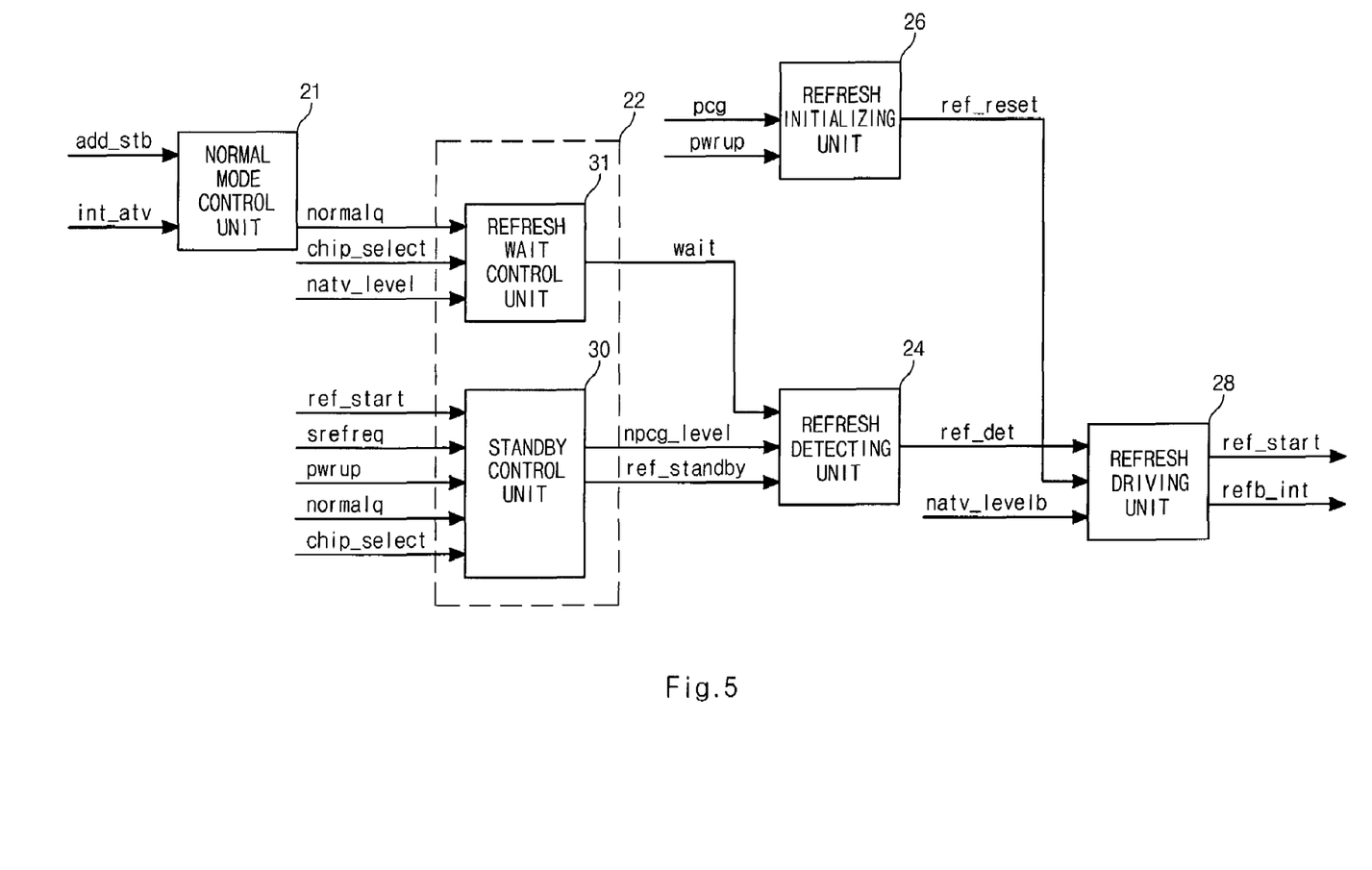
FIG. 5 is a block diagram illustrating a refresh control circuit of a PSRAM according to an embodiment of the present invention.

FIG. 5 is a block diagram illustrating a refresh control circuit of a PSRAM according to an embodiment of the present invention.

In an embodiment, the refresh control circuit comprises a normal mode control unit 21, a refresh preventing control unit 22, a refresh detecting unit 24, a refresh initializing unit 26 and a refresh driving unit 28. Here, the refresh preventing control unit 22 includes a standby control unit 30 and a refresh wait control unit 31.

Figure 6:
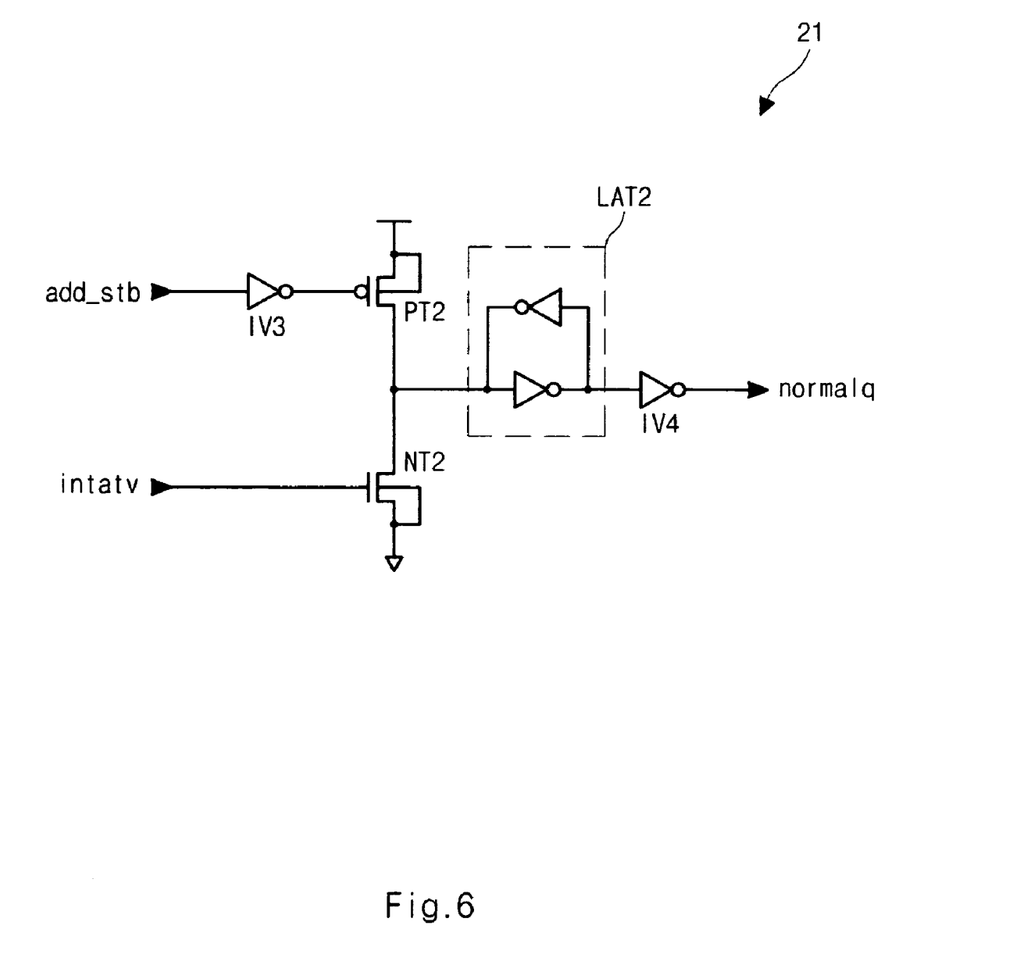
FIG. 6 is a circuit diagram illustrating a normal mode control unit 21 of FIG. 5.

FIG. 6 is a circuit diagram illustrating the normal mode control unit 21 of FIG. 5.

The normal mode control unit 21 comprises inverters IV3 and IV4, a PMOS transistor PT2, a NMOS transistor NT2, and a latch unit LAT2.

The normal mode control unit 21 generates a normal mode control signal normalq in response to an address strobe signal add_stb and an internal active signal int_atv.

When an address is changed, the address strobe signal add_stb is activated, so that the normal mode control signal normalq is activated to a high level by the PMOS transistor PT2.

Meanwhile, when the internal active signal int_atv is activated, the normal mode control signal normalq is inactivated to a low level by the NMOS transistor NT2. Here, the latch unit LAT2 maintains the level state of the normal mode control signal normalq.

The standby control unit 30 of the refresh preventing control unit 22 generates a refresh standby state setting signal ref_standby when a self-refresh requiring signal srefreq is activated.

Here, when the precharge signal pcg is generated after a precharge or internal performance operation is externally completed, an idle state starts internally, so that a refresh operation can be performed.

A normal mode control signal normalq, which is generated when a row access performance is externally performed, requires a precharge period when an address is changed. Here, the refresh operation is prevented.

If the refresh operation is performed when the normal mode control signal normalq is generated, the refresh operation is performed in the precharge period to destroy cell data.

When the normal mode control signal normalq or a level signal natv_level is generated, the refresh wait control unit 31 generates a wait signal so that the refresh operation may not be performed.

When the refresh operation is at the standby state, the wait signal is inactivated to a low level by the precharge operation and a level signal npcg_level delayed in the precharge operation is inputted, the refresh detecting unit 24 generates a refresh detecting signal ref_det to perform the refresh operation.

A refresh start signal ref_start is generated to have a high pulse depending on external row access. Here, if the level signal natv_level is required and the row access is faster than an internal refresh signal refb_int, the pulse of the refresh start signal ref_start is not generated, and the refresh operation is performed after the row access.

Figure 7:
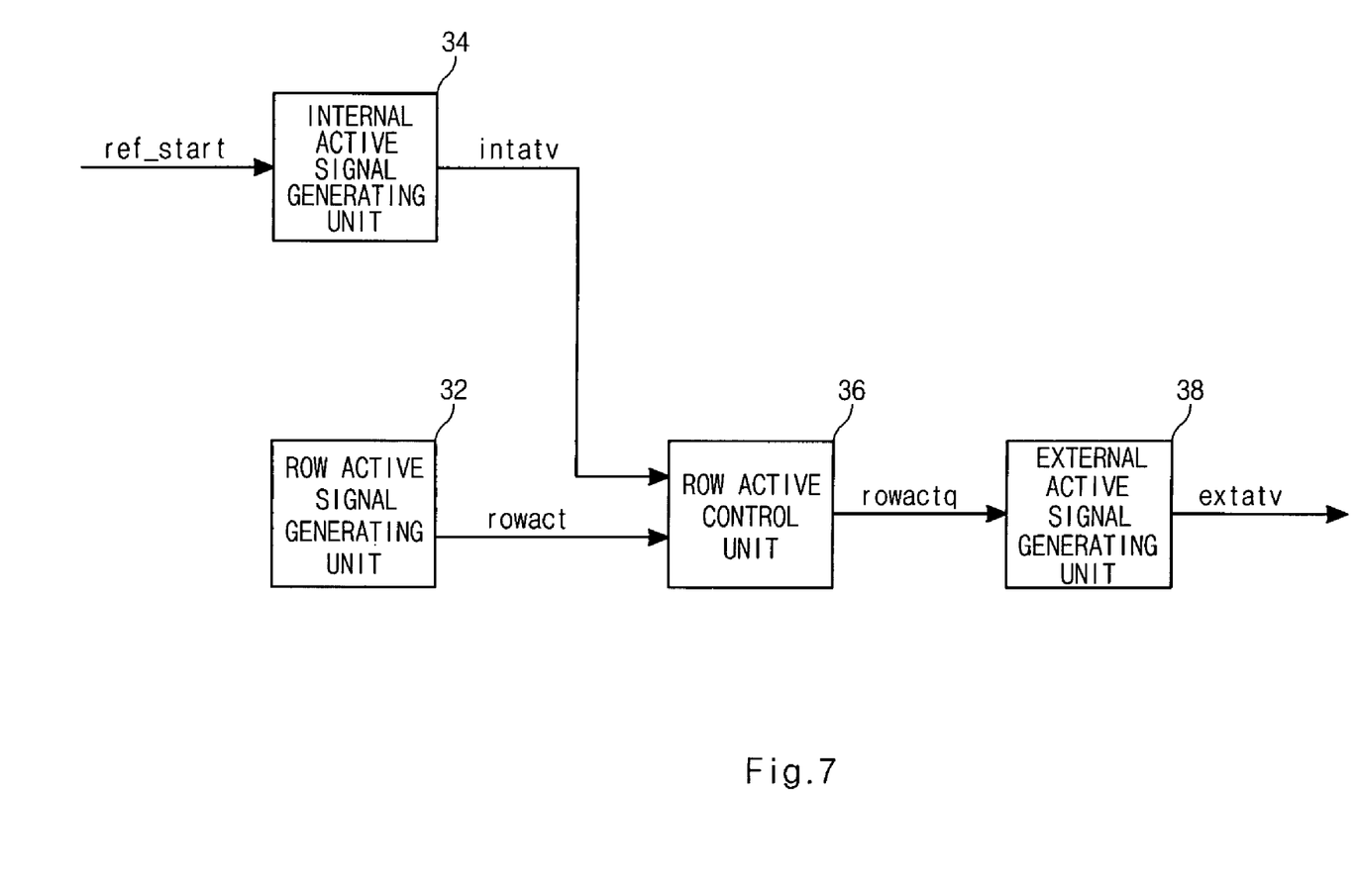
FIG. 7 is a block diagram illustrating a row active control circuit of a PSRAM according to an embodiment of the present invention.

FIG. 7 is a block diagram illustrating a row active control circuit of a PSRAM according to an embodiment of the present invention.

In an embodiment, the row active control circuit comprises a row active signal generating unit 32, an internal active signal generating unit 34, a row active control unit 36 and an external active signal generating unit 38.

The row active signal generating unit 32 generates a row active signal rowact when an active condition is set.

The internal active signal generating unit 34 generates an internal active signal intatv in response to a refresh start signal ref_start.

The row active control unit 36 generates a row active standby signal rowactq with the row active signal rowact in response to the internal active signal intatv.

The external active signal generating unit 38 generates an external active control signal extatv in response to the row active standby signal rowactq.

Figure 8:
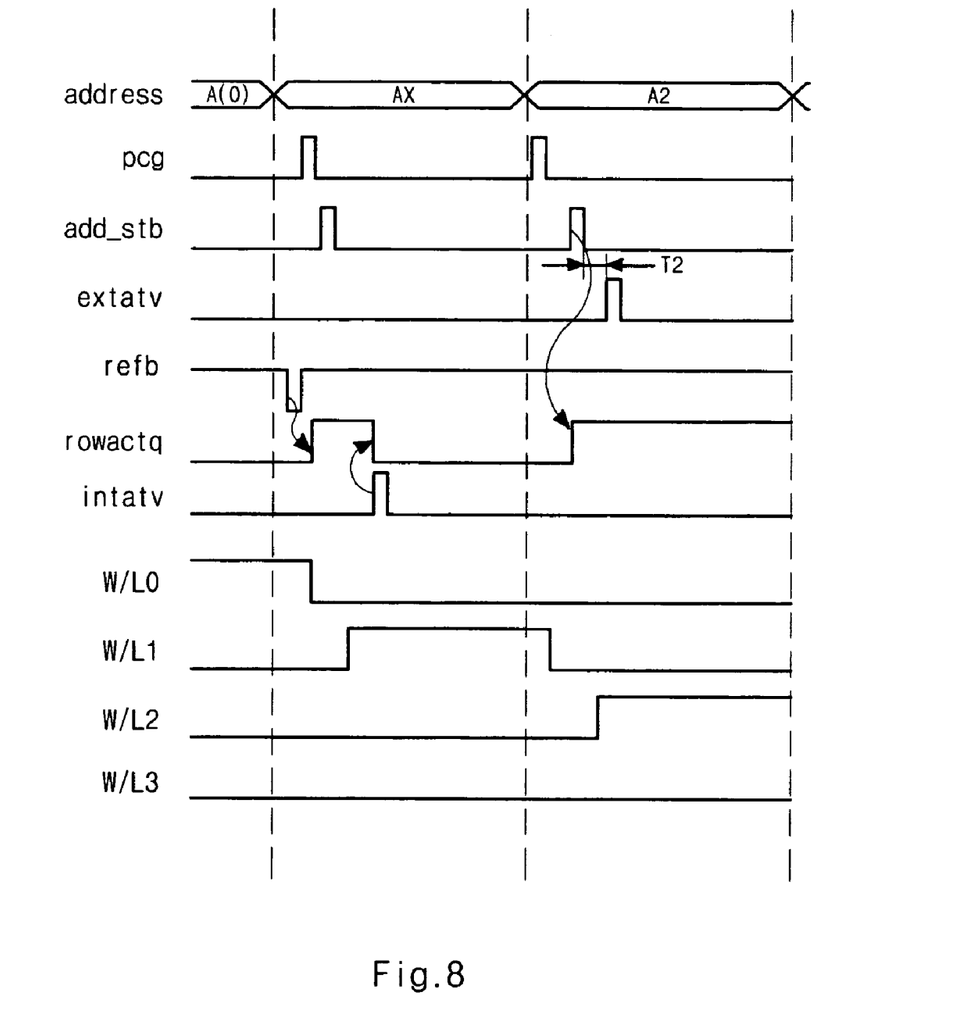
FIG. 8 is a timing diagram illustrating the operation of the row active control circuit of FIG. 7.

FIG. 8 is a timing diagram illustrating the operation of the row active control circuit of FIG. 7. Here, an example when a word line W/L1 is refreshed is exemplified, so that an address AX is invalid.

First, an external address is changed, and an address strobe signal add_stb to receive the address is generated. Then, a row active signal rowact for generating an active signal extatv or intatv is generated.

Here, when a refresh signal refb is generated, the row active signal rowact becomes at a standby state, and the row active standby signal rowactq is generated.

Additionally, when the refresh start signal ref_start is generated in response to the refresh signal refb, the internal active signal intatv is generated to disable the row active standby signal rowactq.

Accordingly, in the row active control circuit according to an embodiment of the present invention, although the address is inputted as an invalid address by disabling the row active standby signal rowactq for starting access with the internal active signal intatv, generation of defects due to shortage of margin T2 between the address strobe signal add_stb and the external active signal extatv is improved.

As discussed earlier, in a row active control circuit according to an embodiment of the present invention, since a refresh operation and a normal operation are simultaneously inputted at a high-speed operation mode for performing a page operation, fail which results from reception of more than two addresses is prevented.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A row active control circuit of a PSRAM, comprising:
   a row active signal generating unit for generating a row active signal when an active condition is set;
   an internal active signal generating unit for generating an internal active signal in response to a refresh start signal, wherein the refresh start signal is at a high level during a refresh operation;
   a row active control unit for generating a row active standby signal with the row active signal in response to the internal active signal, wherein the row active control unit disables the row active standby signal in response to the internal active signal, the refresh operation being performed in the event that a precharge signal is input to the row active control unit when the row active standby signal is disabled such that a normal operation is not performed during the refresh operation; and
   an external active signal generating unit for generating an external active control signal in response to the row active standby signal.

2. The row active control circuit of a PSRAM according to claim 1, wherein in response to input of an address strobe signal, the row active control unit enables the row active standby signal such that the normal operation is performed.

* * * * *

UNITED STATES PATENT AND TRADEMARK OFFICE
CERTIFICATE OF CORRECTION

PATENT NO. : 7,486,574 B2
APPLICATION NO. : 11/074894
DATED : February 3, 2009
INVENTOR(S) : Jong Yeol Yang et al.

It is certified that error appears in the above-identified patent and that said Letters Patent is hereby corrected as shown below:

On the Title Page Item (54) please delete, "ROW ACTIVE CONTROL CIRCUIT OF PSEUDO STATIC RANOM ACCESS MEMORY"

and insert

-- ROW ACTIVE CONTROL CIRCUIT OF PSEUDO STATIC RANDOM ACCESS MEMORY. --

Signed and Sealed this

Nineteenth Day of May, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,486,574 B2  Page 1 of 1
APPLICATION NO. : 11/074894
DATED : February 3, 2009
INVENTOR(S) : Jong Yeol Yang et al.

It is certified that error appears in the above-identified patent and that said Letters Patent is hereby corrected as shown below:

On the Title Page, Item (54) and Column 1, lines 1 and 2, please delete, "ROW ACTIVE CONTROL CIRCUIT OF PSEUDO STATIC RANOM ACCESS MEMORY"

and insert

-- ROW ACTIVE CONTROL CIRCUIT OF PSEUDO STATIC RANDOM ACCESS MEMORY. --

This certificate supersedes the Certificate of Correction issued May 19, 2009.

Signed and Sealed this

Ninth Day of June, 2009

JOHN DOLL
*Acting Director of the United States Patent and Trademark Office*